(12) United States Patent
Lee et al.

(10) Patent No.: US 12,550,579 B2
(45) Date of Patent: Feb. 10, 2026

(54) DISPLAY DEVICE

(71) Applicant: Samsung Display Co., LTD., Yongin-si (KR)

(72) Inventors: Doohyun Lee, Seongnam-si (KR); Hyojoo Jung, Yongin-si (KR); Byoung-Hun Sung, Yongin-si (KR); Jun-Woo Hyung, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 465 days.

(21) Appl. No.: 18/097,103

(22) Filed: Jan. 13, 2023

(65) Prior Publication Data

US 2023/0247888 A1 Aug. 3, 2023

(30) Foreign Application Priority Data

Jan. 28, 2022 (KR) .......................... 10-2022-0013716

(51) Int. Cl.
*H10K 59/38* (2023.01)
*H10K 59/122* (2023.01)

(52) U.S. Cl.
CPC ............ *H10K 59/38* (2023.02); *H10K 59/122* (2023.02)

(58) Field of Classification Search
CPC ........... H10K 59/122; H10H 29/30–49; H10H 29/857; H10H 20/857; H01L 25/0753; H01L 25/167; H01L 33/62
See application file for complete search history.

(56) References Cited

U.S. PATENT DOCUMENTS

| | | | | |
|---|---|---|---|---|
| 7,903,055 B2 * | 3/2011 | Nishikawa | ............. | H05B 33/22 345/80 |
| 8,415,675 B2 * | 4/2013 | Im | ........................ | H10K 59/124 257/40 |
| 9,653,520 B2 * | 5/2017 | Kim | ................... | H10K 59/1213 |

(Continued)

FOREIGN PATENT DOCUMENTS

| | | | | |
|---|---|---|---|---|
| KR | 20150077261 A | * | 7/2015 | .......... H10K 50/858 |
| KR | 1020170047473 | | 5/2017 | |

(Continued)

OTHER PUBLICATIONS

Korean Office Action mailed Nov. 5, 2025 in KR Application No. 10-2022-0013716, (w/English translation), 13 pages.

*Primary Examiner* — Lauren R Bell
(74) *Attorney, Agent, or Firm* — CANTOR COLBURN LLP

(57) ABSTRACT

A display device includes a transistor substrate including a first transistor and a second transistor, a first color conversion layer and a second color conversion layer disposed on the transistor substrate, a bank layer which surrounds the first color conversion layer and the second color conversion layer, and in which a concave pattern is defined, a first light-emitting element and a second light-emitting element disposed on the first color conversion layer and the second color conversion layer, overlapping the first color conversion layer and the second color conversion layer, and emitting light in a direction in which the first color conversion layer and the second color conversion layer are disposed, and a pixel defining layer surrounding the first light-emitting element and the second light-emitting element, and filling the concave pattern.

20 Claims, 17 Drawing Sheets

(56) References Cited

U.S. PATENT DOCUMENTS

| | | | | |
|---|---|---|---|---|
| 10,446,626 | B2 * | 10/2019 | Yun | H10K 59/124 |
| 2018/0197929 | A1 * | 7/2018 | Cho | H10K 50/854 |
| 2020/0058721 | A1 * | 2/2020 | Sim | H10K 50/856 |
| 2020/0075699 | A1 * | 3/2020 | Kim | H10K 59/80515 |
| 2020/0251675 | A1 | 8/2020 | Zhang et al. | |
| 2020/0328269 | A1 * | 10/2020 | Shin | H10K 59/124 |
| 2022/0140291 | A1 * | 5/2022 | Kim | H10K 59/126 257/40 |
| 2023/0209946 | A1 * | 6/2023 | Min | H10K 59/1213 257/40 |

FOREIGN PATENT DOCUMENTS

| | | | | |
|---|---|---|---|---|
| KR | 1020170063246 A | | 6/2017 | |
| KR | 20190013130 A | * | 2/2019 | H01L 27/3258 |
| KR | 1020190023404 A | | 3/2019 | |
| KR | 1020190061744 | | 6/2019 | |
| KR | 1020200030147 | | 3/2020 | |
| KR | 102168045 | | 10/2020 | |

* cited by examiner

DISPLAY DEVICE

This application claims priority to Korean Patent Application No. 10-2022-0013716, filed on Jan. 28, 2022, and all the benefits accruing therefrom under 35 U.S.C. § 119, the content of which in its entirety is herein incorporated by reference.

BACKGROUND

1. Field

Embodiments of the inventive concept relate generally to a display device displaying an image.

2. Description of the Related Art

A display device is manufactured and used in various ways. The display device may display image to provide visual information to user. Such a display device may include a liquid crystal display device that emits light using a liquid crystal layer, an inorganic light-emitting display device that emits light using an inorganic light-emitting diode, and an organic light-emitting display device that emits light using an organic light-emitting diode.

The display device may include a color conversion layer to convert color of light emitted from a light-emitting element, e.g., the inorganic and organic light-emitting diodes. In this case, in order to increase display efficiency of the light emitted from the light-emitting element, many studies are being conducted.

SUMMARY

Embodiments provide a display device displaying an image.

A display device in an embodiment may include a transistor substrate including a first transistor and a second transistor, a first color conversion layer and a second color conversion layer disposed on the transistor substrate, a bank layer which surrounds the first color conversion layer and the second color conversion layer, and in which a concave pattern is defined, a first light-emitting element and a second light-emitting element disposed on the first color conversion layer and the second color conversion layer to overlap the first color conversion layer and the second color conversion layer, and emitting light in a direction in which the first color conversion layer and the second color conversion layer are disposed, and a pixel defining layer surrounding the first light-emitting element and the second light-emitting element, and filling the concave pattern.

In an embodiment, the display device may further include a plurality of color filters disposed between the transistor substrate and the first color conversion layer, the second color conversion layer, and the bank layer, and a refractive layer disposed between the plurality of color filters and the first color conversion layer, the second color conversion layer, and the bank layer.

In an embodiment, the plurality of color filters may include an opening exposing the transistor substrate in an area overlapping the first color conversion layer.

In an embodiment, the plurality of color filters may overlap each other in an area overlapping the concave pattern.

In an embodiment, each of the first color conversion layer and the second color conversion layer may include a scattering body, and the second color conversion layer may further include a quantum dot.

In an embodiment, the first light-emitting element may be connected to the first transistor through a first contact hole penetrating the bank layer, and a second contact hole penetrating the plurality of color filters and the transistor substrate, and the second light-emitting element may be connected to the second transistor through a third contact hole penetrating the bank layer, and a fourth contact hole penetrating the plurality of color filters and the transistor substrate.

In an embodiment, a first angle of each of the first contact hole and the third contact hole with respect to a lower surface of the bank layer may be smaller than a second angle of each of the second contact hole and the fourth contact hole with respect to an upper surface of the transistor substrate.

In an embodiment, the first angle may be about 60 degrees to about 80 degrees, and the second angle may be about 80 degrees to about 90 degrees.

In an embodiment, the transistor substrate may further include a first voltage electrode connected to the first light-emitting element and a second voltage electrode connected to the second light-emitting element. The first light-emitting element may be connected to the first voltage electrode through a first contact hole penetrating the bank layer, and a second contact hole penetrating the plurality of color filters and the transistor substrate. The second light-emitting element may be connected to the second voltage electrode through a third contact hole penetrating the bank layer, and a fourth contact hole penetrating the plurality of color filters and the transistor substrate.

In an embodiment, a first angle of each of the first contact hole and the third contact hole with respect to a lower surface of the bank layer may be smaller than a second angle of each of the second contact hole and the fourth contact hole with respect to an upper surface of the transistor substrate.

In an embodiment, the first angle may be about 60 degrees to about 80 degrees, and the second angle may be about 80 degrees to about 90 degrees.

A display device in another embodiment may include a transistor substrate including a first transistor, a second transistor, a third transistor, and a fourth transistor, a plurality of color filters disposed on the transistor substrate, a refractive layer disposed on the plurality of color filters, a first color conversion layer, a second color conversion layer, a third color conversion layer, and a fourth color conversion layer disposed on the refractive layer, a bank layer which surrounds the first color conversion layer, the second color conversion layer, the third color conversion layer, and the fourth color conversion layer, and in which a concave pattern is defined, a first light-emitting element, a second light-emitting element, a third light-emitting element, and a fourth light-emitting element disposed on the first color conversion layer, the second color conversion layer, the third color conversion layer, and the fourth color conversion layer to overlap the first color conversion layer, the second color conversion layer, the third color conversion layer, and the fourth color conversion layer, and emitting light in a direction in which the first color conversion layer, the second color conversion layer, the third color conversion layer, and the fourth color conversion layer are disposed, and a pixel defining layer surrounding the first light-emitting element, the second light-emitting element, the third light-emitting element, and the fourth light-emitting element, and filling the concave pattern.

In an embodiment, the first light-emitting element, the second light-emitting element, the third light-emitting element, and the fourth light-emitting element may be arranged in a stripe shape in a plan view.

In an embodiment, the first light-emitting element, the second light-emitting element, the third light-emitting element, and the fourth light-emitting element may be arranged in a diamond shape in a plan view.

In an embodiment, the plurality of color filters may include an opening exposing the transistor substrate in an area overlapping the first color conversion layer, and the plurality of color filters may overlap each other in an area overlapping the concave pattern.

In an embodiment, each of the first color conversion layer, the second color conversion layer, the third color conversion layer, and the fourth color conversion layer may include a scattering body, and each of the second color conversion layer, third color conversion layer, and the fourth color conversion layer may further include a quantum dot.

In an embodiment, the first light-emitting element may be connected to the first transistor through a first contact hole penetrating the bank layer, and a second contact hole penetrating the plurality of color filters and the transistor substrate. The second light-emitting element may be connected to the second transistor through a third contact hole penetrating the bank layer, and a fourth contact hole penetrating the plurality of color filters and the transistor substrate. The third light-emitting element may be connected to the third transistor through a fifth contact hole penetrating the bank layer, and a sixth contact hole penetrating the plurality of color filters and the transistor substrate. The fourth light-emitting element may be connected to the fourth transistor through a seventh contact hole penetrating the bank layer, and an eighth contact hole penetrating the plurality of color filters and the transistor substrate.

In an embodiment, a first angle of each of the first contact hole, the third contact hole, the fifth contact hole, and the seventh contact hole with respect to a lower surface of the bank layer may be smaller than a second angle of each of the second contact hole, the fourth contact hole, the sixth contact hole, and the eighth contact hole with respect to an upper surface of the transistor substrate. The first angle may be about 60 degrees to about 80 degrees, and the second angle may be about 80 degrees to about 90 degrees.

In an embodiment, the transistor substrate may further include a first voltage electrode, a second voltage electrode, a third voltage electrode, and a fourth voltage electrode connected to the first light-emitting element, the second light-emitting element, the third light-emitting element, and the fourth light-emitting element. The first light-emitting element may be connected to the first voltage electrode through a first contact hole penetrating the bank layer, and a second contact hole penetrating the plurality of color filters and the transistor substrate. The second light-emitting element may be connected to the second voltage electrode through a third contact hole penetrating the bank layer, and a fourth contact hole penetrating the plurality of color filters and the transistor substrate. The third light-emitting element may be connected to the third voltage electrode through a fifth contact hole penetrating the bank layer, and a sixth contact hole penetrating the plurality of color filters and the transistor substrate. The fourth light-emitting element may be connected to the fourth voltage electrode through a seventh contact hole penetrating the bank layer, and an eighth contact hole penetrating the plurality of color filters and the transistor substrate.

In an embodiment, a first angle of each of the first contact hole, the third contact hole, the fifth contact hole, and the seventh contact hole with respect to a lower surface of the bank layer may be smaller than a second angle of each of the second contact hole, the fourth contact hole, the sixth contact hole, and the eighth contact hole with respect to an upper surface of the transistor substrate. The first angle may be about 60 degrees to about 80 degrees, and the second angle may be about 80 degrees to about 90 degrees.

In the display device in embodiments, a plurality of color conversion layers, a refractive layer, and a plurality of color filters may be disposed between a transistor substrate and a plurality of light-emitting elements. Accordingly, a distance between the plurality of light-emitting elements and the plurality of color conversion layers may be relatively reduced. Accordingly, conversion rate of light incident to the plurality of color conversion layers may increase, and even when thickness of each of the plurality of color conversion layers is reduced compared to the prior art, conversion rate of light incident to the plurality of color conversion layers may be substantially the same as that of the prior art. Accordingly, thickness of the display device may be reduced.

In the display device in embodiments, a concave pattern accommodating ink erroneously deposited may be defined in a bank layer, and a pixel defining layer may fill the concave pattern. Accordingly, the bank layer and the pixel defining layer may prevent light emitted from the plurality of light-emitting elements from being mixed.

It is to be understood that both the foregoing general description and the following detailed description are examples and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure together with the description.

DETAILED DESCRIPTION

Figure 1:
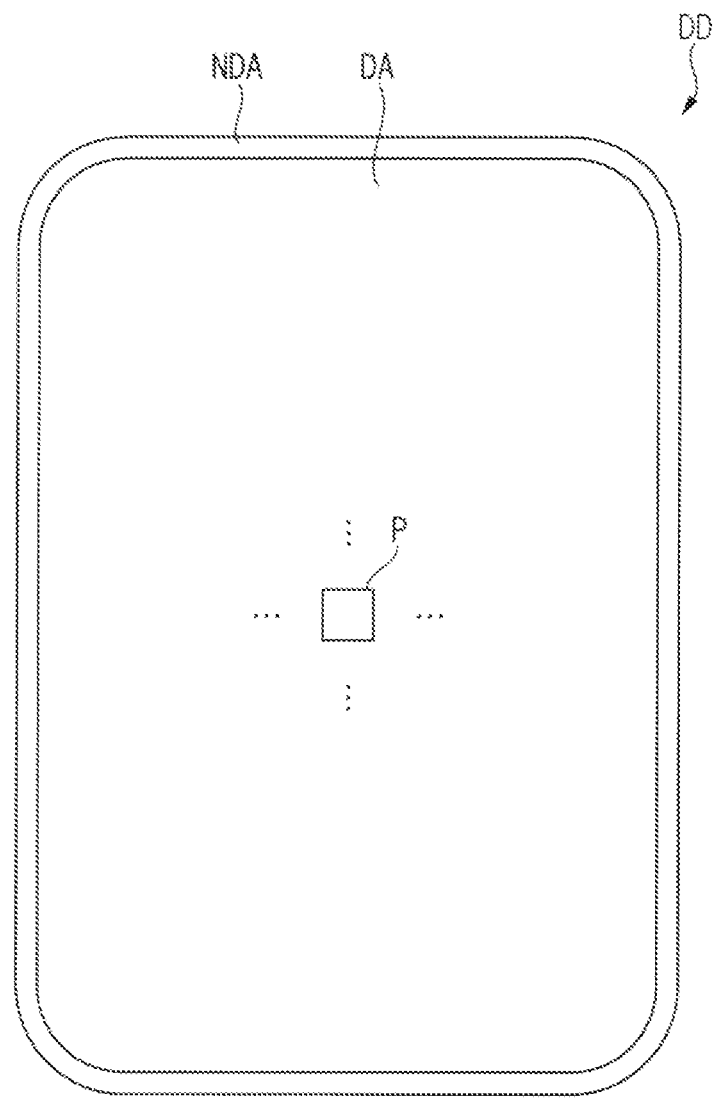
FIG. 1 is a plan view illustrating an embodiment of a display device.

Illustrative, non-limiting embodiments will be more clearly understood from the following detailed description in conjunction with the accompanying drawings.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

FIG. 1 is a plan view illustrating an embodiment of a display device.

Referring to FIG. 1, a display device DD may include a display area DA and a non-display area NDA. The non-display area NDA may surround the display area DA.

The display area DA may be defined as an area displaying an image. To this end, a plurality of pixels P may be disposed in the display area DA. Each of the plurality of pixels P may include a plurality of sub-pixels. In an embodiment, each of the plurality of pixels P may include a red sub-pixel emitting red light, a green sub-pixel emitting green light, and a blue sub-pixel emitting blue light, for example. In an alternative embodiment, each of plurality of pixels P may include a red sub-pixel emitting red light, a green sub-pixel emitting green light, a blue sub-pixel emitting blue light, and a white sub-pixel emitting white light. In addition, each of the plurality of pixels P may include various type of sub-pixels, but in the following example, each of the plurality of pixels P including a red sub-pixel, a green sub-pixel, a blue sub-pixel, and a white sub-pixel will be described.

Driving parts may be disposed in the non-display area NDA. The driving parts may be connected to the plurality of pixels P, and may transmit various signals to the plurality of pixels P.

Figure 2:
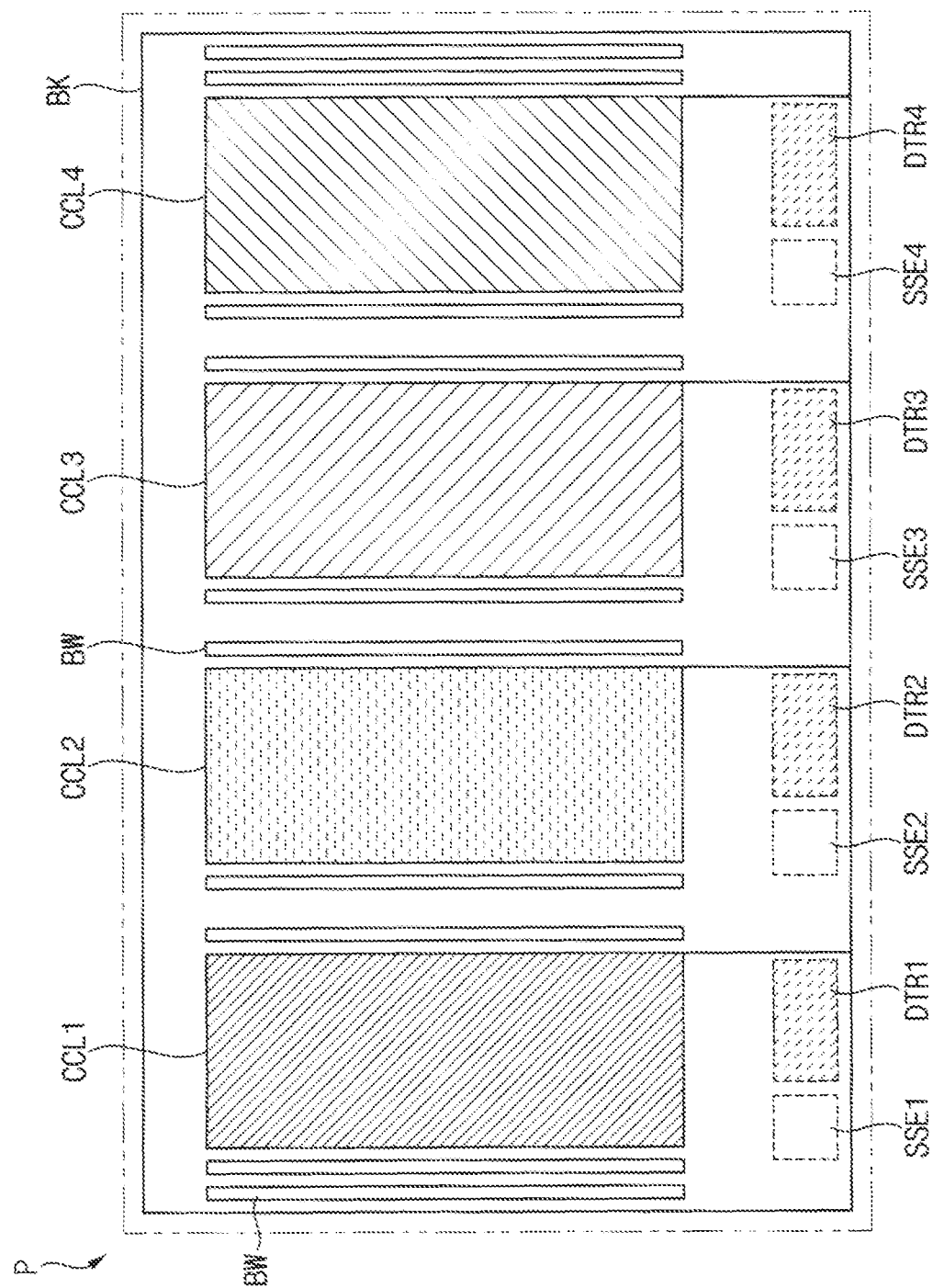
FIG. 2 and FIG. 3 are diagrams illustrating an embodiment of a pixel included in the display device of FIG. 1.
Figure 3:
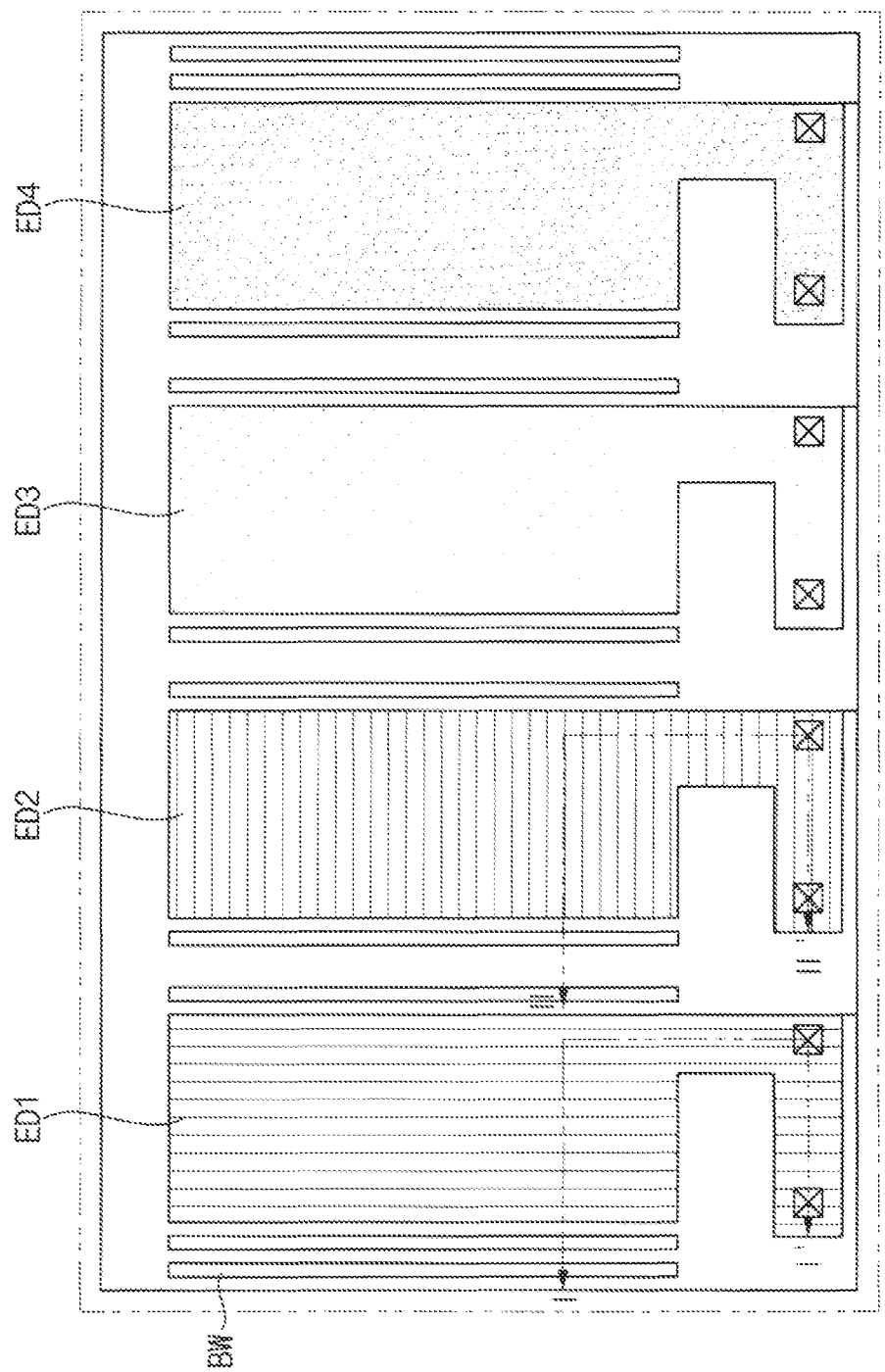

FIG. 2 and FIG. 3 are diagrams illustrating an embodiment of a pixel included in the display device of FIG. 1.

Referring to FIG. 3, a pixel P may include a plurality of sub-pixels. The plurality of sub-pixels may be disposed in different areas. An area in which the plurality of sub-pixels is disposed may be divided into four areas. The four areas may include a first sub-pixel area in which a first color conversion layer CCL1, a first power electrode SSE1, and a first driving transistor DTR1 are disposed, a second sub-pixel area in which a second color conversion layer CCL2, a second power electrode SSE2, and a second driving transistor DTR2 are disposed, a third sub-pixel area in which a third color conversion layer CCL3, a third power electrode SSE3, and a third driving transistor DTR3 are disposed, and a fourth sub-pixel area in which a fourth color conversion layer CCL4, a fourth power electrode SSE4, and a fourth driving transistor DTR4 are disposed. For convenience of explanation, only some of the elements disposed in each of the sub-pixel areas are illustrated in FIG. 2. Various elements may be additionally disposed in each of the sub-pixel areas.

The first color conversion layer CCL1, the second color conversion layer CCL2, the third color conversion layer CCL3, and the fourth color conversion layer CCL4 may be partitioned by a bank layer BK. The first to fourth color conversion layers CCL1, CCL2, CCL3, and CCL4 may be formed by inkjet process. A concave pattern BW may be defined in the bank layer BK. The concave pattern BW may be defined by patterning the bank layer, and may have a predetermined space. Ink erroneously deposited and/or ink overflowing the first to fourth color conversion layers CCL1, CCL2, CCL3, and CCL4 during the inkjet process may be accommodated in the concave pattern BW.

Although, it is illustrated in FIG. 2 that the concave pattern BW is defined only at sides of each of the first to fourth color conversion layers CCL1, CCL2, CCL3, and CCL4, the position at which the concave pattern BW is defined may not be limited thereto. In an embodiment, the concave pattern BW may surround the first to fourth color conversion layers CCL1, CCL2, CCL3, and CCL4, for example.

Referring to FIG. 3, a first light-emitting element ED1 may be disposed on the first sub-pixel area, a second light-emitting element ED2 may be disposed on the second sub-pixel area, a third light-emitting element ED3 may be disposed on the third sub-pixel area, and a fourth light-emitting element ED4 may be disposed on the fourth sub-pixel area.

In this case, each of the first to fourth light-emitting elements ED1, ED2, ED3, and ED4 may be a light-emitting element emitting white light. To this end, each of the first to fourth light-emitting elements ED1, ED2, ED3, and ED4 may have a structure in which light-emitting layers are stacked. In an embodiment, each of the first to fourth light-emitting elements ED1, ED2, ED3, and ED4 may have a structure in which a blue light-emitting layer emitting blue light, a yellow light-emitting layer emitting yellow light, and a blue light-emitting layer emitting blue light are sequentially stacked, for example. However, the invention is not limited thereto, and each of the first to fourth light-emitting elements ED1, ED2, ED3, and ED4 may have a structure in which light-emitting layers emitting light of various colors may be sequentially stacked. White light emitted from the first to fourth light-emitting layers ED1, ED2, ED3, and ED4 may pass through the first to fourth color conversion layers CCL1, CCL2, CCL3, and CCL4 and may be converted to have the same color or a different color.

In an embodiment, the first to fourth light-emitting elements ED1, ED2, ED3, and ED4 may be arranged in a stripe shape in a plan view.

Figure 4:
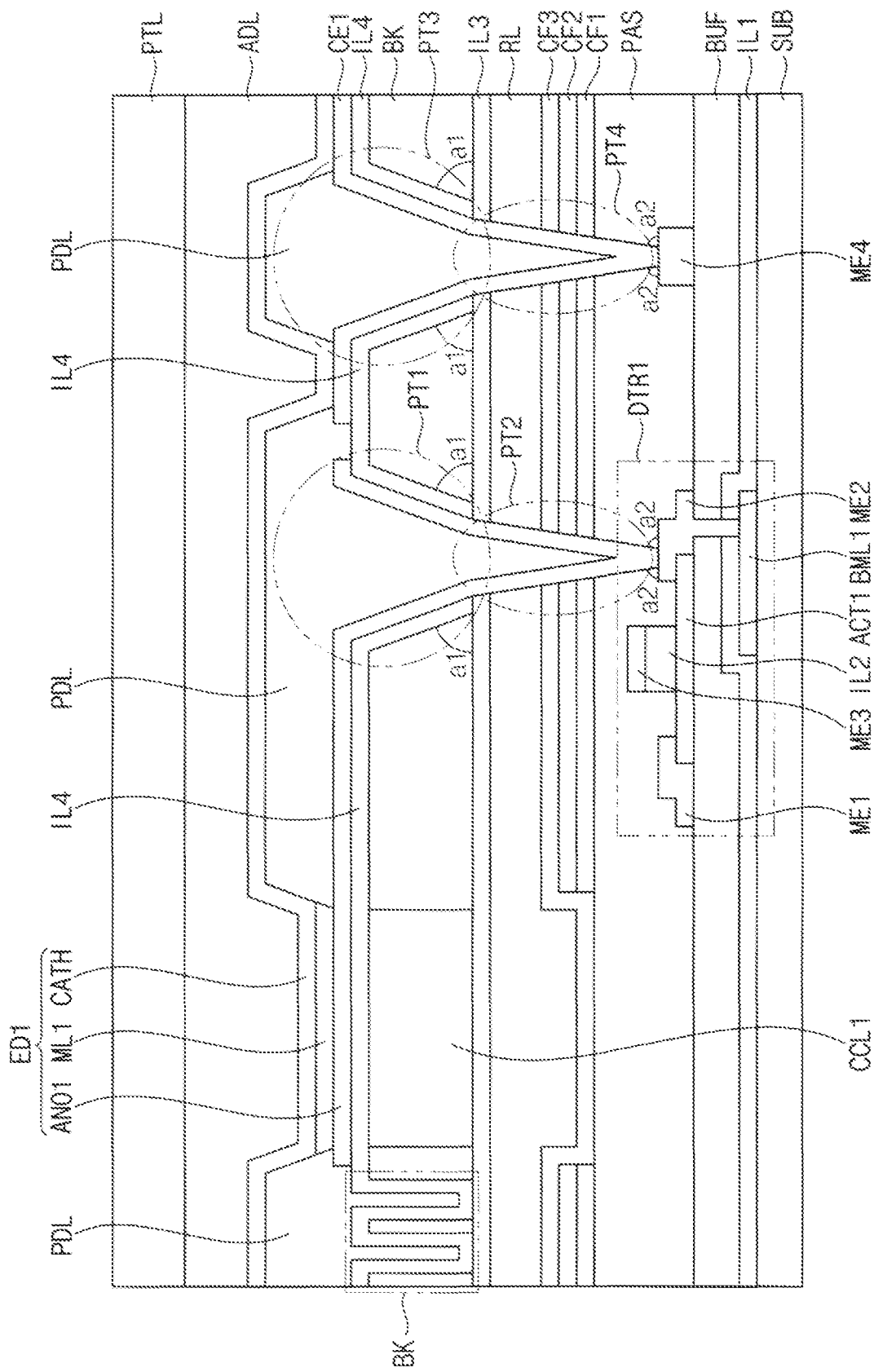
FIG. 4 is a cross-sectional view taken along line I-I' of FIG. 3.

FIG. 4 is a cross-sectional view taken along line I-I' of FIG. 3.

Referring to FIG. 3 and FIG. 4, the display device DD may include a substrate SUB, a first insulation layer IL1, a buffer layer BUF, a first lower electrode BML1, a first electrode ME1, a second electrode ME2, a third electrode ME3, a fourth electrode ME4, a second insulation layer IL2, a passivation layer PAS, a first color filter CF1, a second color filter CF2, a third color filter CF3, a refractive layer RL, a third insulation layer IL3, a bank layer BK, a fourth insulation layer IL4, a first connection electrode CE1, a first anode electrode ANO1, a pixel defining layer PDL, a first light-emitting layer ML1, a cathode electrode CATH, an adhesive layer ADL, and a protective layer PTL.

The substrate SUB may support the display device DD. The substrate SUB may include various materials. In an embodiment, the substrate SUB may include glass, for example.

The first lower electrode BML1 may be disposed on the substrate SUB. The first lower electrode BML1 may be electrically connected to the driving parts and may receive signals transmitted from the driving parts. Various signals may be applied to the first lower electrode BML1. In an embodiment, a first power voltage applied to the first anode electrode ANO1 may be applied to the first lower electrode BML1, for example. The first lower electrode BML1 may include metal, alloy, metal oxide, transparent conductive material, etc. In an embodiment, the first lower electrode BML1 may include silver (Ag), alloy including silver, molybdenum (Mo), alloy including molybdenum, aluminum (Al), alloy including aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide ("ITO"), indium zinc oxide ("IZO"), etc., for example.

The first insulation layer IL1 may be disposed on the substrate SUB to cover the first lower electrode BML1. The first insulation layer IL1 may include an insulation material. Examples of the insulation material may be silicon oxide, silicon nitride, silicon oxynitride, etc. These may be used alone or in combination with each other.

The buffer layer BUF may be disposed on the first insulation layer IL1. The buffer layer BUF may include an insulation material. Examples of the insulation material may be silicon oxide, silicon nitride, silicon oxynitride, etc. These may be used alone or in combination with each other.

A first active layer ACT1 may be disposed on the buffer layer BUF. In an embodiment, the first active layer ACT1 may include silicon semiconductor. In an embodiment, the first active layer ACT1 may include amorphous silicon, polycrystalline silicon, etc. In an alternative embodiment, in embodiments, the first active layer ACT1 may include oxide semiconductor. In an embodiment, the first active layer ACT1 may include indium-gallium-zinc oxide, indium-gallium oxide, indium-zinc oxide, etc., for example.

The first electrode ME1 and the second electrode ME2 may cover opposite sides of the first active layer ACT1. The second insulation layer IL2 may cover center portion of the first active layer ACT1. The third electrode ME3 may be disposed on the second insulation layer IL2. The first electrode ME1 and the second electrode ME2 may be electrically connected to each other based on a signal applied to the third electrode ME3. The second electrode ME2 may be connected to the first lower electrode BML1 through contact hole. The fourth electrode ME4 may be disposed on the buffer layer BUF. A second power voltage may be applied to the fourth electrode ME4. The fourth electrode ME4 may correspond to the first power electrode SSE1 of FIG. 2. The first power voltage may have a higher voltage level than the second power voltage. The first power voltage may be defined as a high level voltage and the second power may be defined as a low level voltage based on the voltage level. The first power voltage and the second power voltage may be transmitted to the first light-emitting element ED1. The first to fourth electrodes ME1, ME2, ME3, and ME4 may include metal, alloy, metal oxide, transparent conductive material, etc. In an embodiment, the first to fourth electrodes ME1, ME2, ME3, and ME4 may include silver (Ag), alloy including silver, molybdenum (Mo), alloy including molybdenum, aluminum (Al), alloy including aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), ITO, IZO, etc., for example.

The first lower electrode BML1, the first to third electrodes ME1, ME2, and ME3, and the first active layer ACT1 may be defined as the first driving transistor DRT1.

The passivation layer PAS may cover the first to fourth electrodes ME1, ME2, ME3, and ME4. The passivation layer PAS may include an insulation material. Examples of the insulation material may be silicon oxide, silicon nitride, silicon oxynitride, etc. These may be used alone or in combination with each other.

The substrate SUB to the passivation layer PAS described above may be defined as a transistor substrate.

The first to third color filters CF1, CF2, and CF3 may be disposed on the passivation layer PAS. First to third color filters CF1, CF2, and CF3 may transmit light of different colors. The first color filter CF1 may transmit light having a first color, and may block light having a color other than the first color. The second color filter CF2 may transmit light having a second color, and may block light having a color other than the second color. The third color filter CF3 may transmit light having a third color, and may block light having a color other than the third color. In an embodiment, the first color filter CF1 may transmit any one of red light, blue light, and green light, the second color filter CF2 may transmit another one, and the third color filter CF3 may transmit the other one, for example.

The first to third color filters CF1, CF2, and CF3 may overlap each other in an area overlapping the concave pattern BW. To this end, the first to third color filters CF1, CF2, and CF3 may prevent light of different colors from being mixed.

The refractive layer RL may be disposed on the first to third color filters CF1, CF2, and CF3. The refractive layer RL may have relatively low refractive index. In an embodiment, the refractive layer RL may have a refractive index lower than 2, for example. To this end, the refractive layer RL may adjust path of light emitted from the first light-emitting element ED1 to increase luminous efficiency of the display device DD.

The third insulation layer IL3 may be disposed on the refractive layer RL. The third insulation layer IL3 may include an insulation material. Examples of the insulation layer may be silicon oxide, silicon nitride, silicon oxynitride, etc. These may be used alone or in combination with each other.

The first color conversion layer CCL1 may be disposed on the third insulation layer IL3. The first color conversion layer CCL1 may convert color of light emitted from the light-emitting element ED1. In an embodiment, the first color conversion layer CCL1 may convert white light emitted from the first color conversion layer CCL1 into red, green, or blue light, for example. To this end, the first color conversion layer CCL1 may include a quantum dot and a scattering element. The quantum dot may include a core and a shell surrounding the core. The scattering element may scatter light incident to the first color conversion layer CCL1.

The quantum dot may be semiconductor nanocrystalline material. The quantum dot may have a predetermined band-gap according to composition and size of the quantum dot, and may emit light having a unique wavelength after absorbing incident light. Examples of the semiconductor nanocrystalline material may be group IV nanocrystals, group II-VI compound nanocrystals, group III-V compound nanocrystals, group IV-VI nanocrystals, or any combinations thereof. The quantum dot may have a core-shell structure including the core including the semiconductor nanocrystalline material and the shell surrounding the core. Examples of the shell of the quantum dot may be a metal or non-metal oxide, a semiconductor compound, or any combinations thereof.

The bank layer BK may be disposed on the third insulation layer IL3. The bank layer BK may surround the first color conversion layer CCL1. The bank layer BK may include an organic material. The bank layer BK may include a light absorbing material that absorbs visible light. That is, the bank layer BK may include an organic light-blocking material. Examples of the organic light-blocking material may be polystyrene, polymethylmethacrylate ("PMMA"), polyacrylonitrile ("PAN"), polyamide ("PA"), polyimide ("PI"), polyarylether ("PAE"), heterocyclic polymer, parylene, epoxy, benzocyclobutene ("BCB"), siloxane based resin, silane based resin, etc. These may be used alone or in combination with each other. In addition, the bank layer BK may include colored pigment. In an embodiment, the bank layer BK may include black and/or blue pigment, for example. To this end, the bank layer BK may prevent light emitted from the light-emitting elements ED1, ED2, ED3, and ED4 from being mixed.

The concave pattern BW may be defined in the bank layer BK. The concave pattern BW may accommodate ink erroneously deposited and/or ink overflowing the first to fourth color conversion layers CCL1, CCL2, CCL3, and CCL4 during the inkjet process.

The fourth insulation layer IL4 may be disposed on the bank layer BK. The fourth insulation layer IL4 may include an insulation material. Examples of the insulation material may be silicon oxide, silicon nitride, silicon oxynitride, etc. These may be used alone or in combination with each other.

The first anode electrode ANO1 may be disposed on the fourth insulation layer IL4. One end portion of the first anode electrode ANO1 may overlap the first color conversion layer CCL1, and another portion of the first anode electrode ANO1 may be connected to the first driving transistor DTR1 through contact holes. The contact holes may include a first contact hole PT1 penetrating the bank layer BK, and a second contact hole PT2 penetrating the refractive layer RL, the first to third color filters CF1, CF2, and CF3, and a portion of the transistor substrate. The first anode electrode ANO1 may include metal, alloy, metal oxide, transparent conductive material, etc. In an embodiment, the first anode electrode ANO1 may include silver (Ag), alloy including silver, molybdenum (Mo), alloy including molybdenum, aluminum (Al), alloy including aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), ITO, IZO, etc., for example.

The first connection electrode CE1 may be disposed on the fourth insulation layer IL4. One end portion of the first connection electrode CE1 may contact the cathode electrode CATH, and another portion of the first connection electrode CE1 may be connected to the fourth electrode ME4. The contact holes may include a third contact hole PT3 penetrating the bank layer BK, and a fourth contact hole PT4 penetrating the refractive layer RL, the first to third color filters CF1, CF2, and CF3, and a portion of the transistor substrate. The first connection electrode CE1 may include metal, alloy, metal oxide, transparent conductive material, etc. In an embodiment, the first connection electrode CE1 may include silver (Ag), alloy including silver, molybdenum (Mo), alloy including molybdenum, aluminum (Al), alloy including aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), ITO, IZO, etc., for example.

A first angle a1 of the first contact hole PT1 and the third contact hole PT3 with respect to a lower surface of the bank layer BK may be about 60 degrees to about 80 degrees. A second angle a2 of the second contact hole PT2 and the fourth contact hole PT4 with respect to the lower surface of the bank layer BK may be about 80 degrees to about 90 degrees. The second contact hole PT2 and the fourth contact hole PT4 may be formed by a laser drilling process to be thinner and further inclined than the first contact hole PT1 and the third contact hole PT3.

The pixel defining layer PDL may be disposed on the fourth insulation layer IL4. An opening exposing the first anode electrode ANO1 and the first connection electrode CE1 may be defined in the pixel defining layer PDL. The pixel defining layer PDL may include a light absorbing material that absorbs visible light. That is, the pixel defining layer PDL may include an organic light-blocking material. Examples of the organic light-blocking material may be polystyrene, PMMA, PAN, PA, PI, PAE, heterocyclic polymer, parylene, epoxy, BCB, siloxane based resin, silane based resin, etc. These may be used alone or in combination with each other. In addition, the pixel defining layer PDL may include colored pigment. In an embodiment, the pixel defining layer PDL may include black and/or blue pigment, for example. To this end, the pixel defining layer PDL may prevent light emitted from the light-emitting elements ED1, ED2, ED3, and ED4 from being mixed.

The pixel defining layer PDL may fill the concave pattern BW. Although the concave pattern BW accommodates the ink, when the concave pattern BW is left as an empty space, the bank layer BK may not effectively prevent mixing of light emitted from the light-emitting elements ED1, ED2, ED3, and ED4.

The first light-emitting layer ML1 may have a structure in which light-emitting layers are stacked. In an embodiment, the first light-emitting layer ML1 may have a structure in which a blue light-emitting layer emitting blue light, a yellow light-emitting layer emitting yellow light, and a blue light-emitting layer emitting blue light are sequentially stacked, for example. However, this is only one of embodiments of the structure of the first light-emitting layer ML1. The first light-emitting layer ML1 may have a various structure in which light-emitting layer emitting light having various colors are stacked in various orders.

The cathode electrode CATH may cover the pixel defining layer and to contact the first light-emitting layer ML1 and the first connection electrode CE1. The second power voltage transmitted from the fourth electrode ME4 may be applied to the cathode electrode CATH. The cathode electrode CATH may include metal, alloy, metal oxide, transparent conductive material, etc. In an embodiment, the cathode electrode CATH may include silver (Ag), alloy including silver, molybdenum (Mo), alloy including molybdenum, aluminum (Al), alloy including aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), ITO, IZO, etc.

In an embodiment, the first light-emitting element ED1 may emit light in a direction toward the substrate SUB. In this case, the first anode electrode ANO1 may be a transparent electrode, and the cathode electrode CATH may be a reflective electrode.

Examples of the transparent electrode may be ITO, IZO, aluminum zinc oxide ("AZO"), gallium zinc oxide ("GZO"), zinc tin oxide ("ZTO"), gallium tin oxide ("GTO"), fluorine tin oxide ("FTO"), etc. These may be used alone or in combination with each other.

Examples of the refractive electrode may be aluminum (Al), silver (Ag), chromium (Cr), molybdenum (Mo), platinum (Pt), nickel (Ni), etc. These may be used alone or in combination with each other.

The protective layer PTL may be attached on the cathode electrode CATH by the adhesive layer ADL. The protective layer PTL may protect the display device DD from external impact. To this end, the protective layer PTL may include material having rigidity.

In an embodiment of the invention, the first color filter layer CCL1, the refractive layer RL, and the first to third color filters CF1, CF2, and CF3 may be disposed between the transistor substrate and the first light-emitting element ED1. Accordingly, a distance between the first light-emitting element ED1 and the first color conversion layer CCL1 may be relatively reduced. Accordingly, a conversion rate of light incident to the first color conversion layer CCL1 may increase, and even when thickness of the first color conversion layer CCL1 is reduced compared to the prior art, a conversion rate of light incident to the first color conversion layer CCL1 may be substantially the same as that of the prior art. Accordingly, thickness of the display device DD may be reduced.

In FIG. 4, for convenience of description, only a structure of the first sub-pixel area is described. The structure of the first sub-pixel area may be applied to the second sub-pixel area and the third sub-pixel area.

Figure 5:
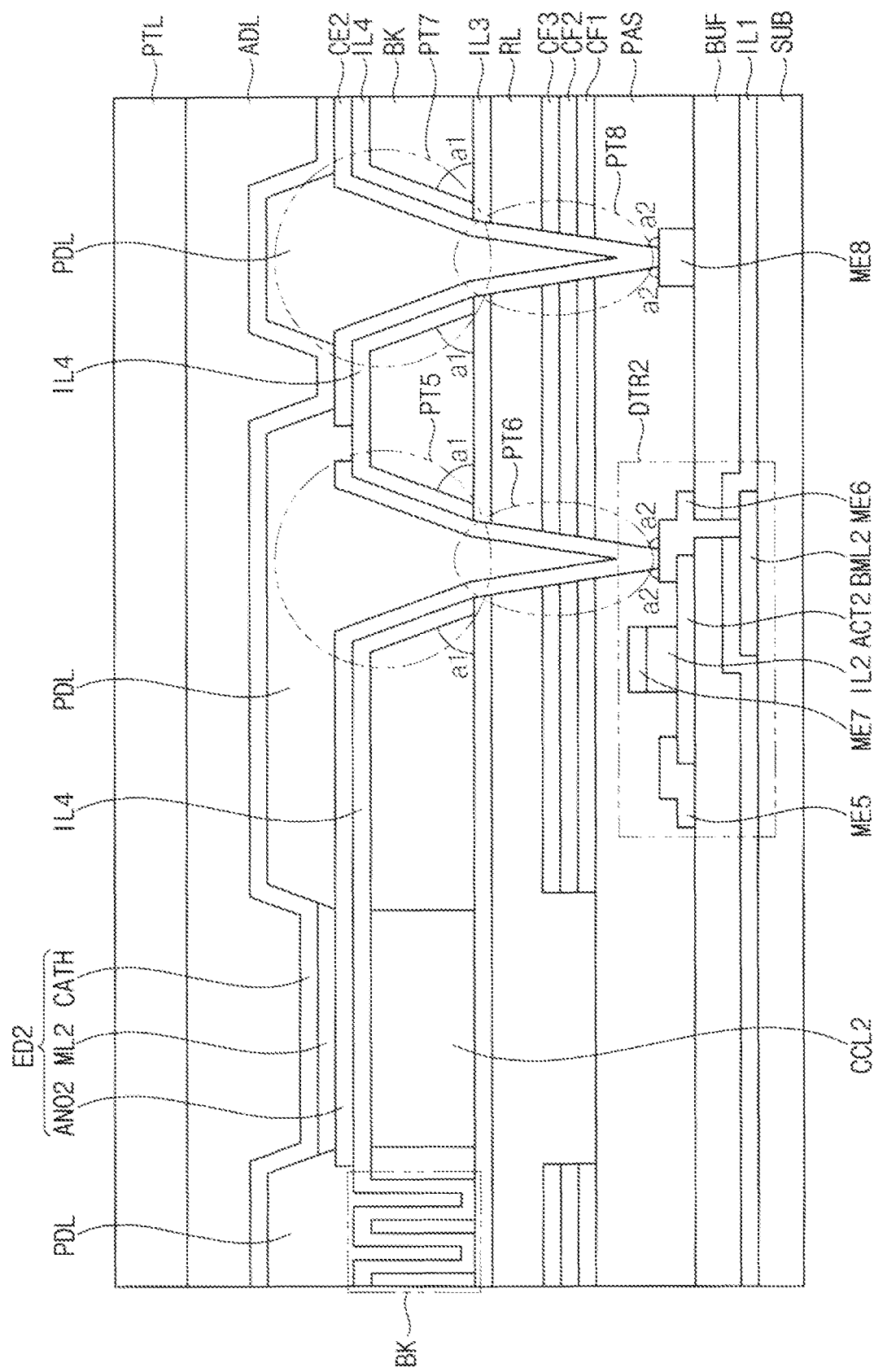
FIG. 5 is a cross-sectional view taken along line II-IF of FIG. 3.

FIG. 5 is a cross-sectional view taken along line II-IF of FIG. 3. Some elements described with reference to FIG. 5 are analogues to or substantially the same as some elements described above with reference to FIG. 4. Differences are mainly described.

Referring to FIG. 3 and FIG. 5, the second light-emitting element ED2 may overlay the second color conversion layer CCL2. The second color conversion layer CCL2 may not include the quantum dot, and may only include the scattering element. Accordingly, white light passing through the second color conversion layer CCL2 may be scattered by the scattering element, and may be emitted to outside of the display device DD.

That is, white light passing through the first, third, and fourth color conversion layers CCL1, CCL3, and CCL4 may be converted to red light, green light, blue light, etc. In contrast, white light passing through the second color conversion layer CCL2 may not substantially change color.

Since the white light does not need to pass through the color filters CF1, CF2, and CF3, the color filters CF1, CF2, and CF3 may not be disposed in an area overlapping the second color conversion layer CCL2. That is, the color filters CF1, CF2, and CF3 may define an opening exposing the transistor substrate.

A second anode electrode ANO2 of the second light-emitting element ED2 may be connected to the second driving transistor DTR2 through a fifth contact hole PT5 penetrating the bank layer BK, and a sixth contact hole PT6 penetrating the first to third color filters CF1, CF2, and CF3, and passivation layer PAS. The first power voltage may be applied to the second anode electrode ANO2 by the second driving transistor DTR2.

A cathode electrode CATH of the second light-emitting element ED2 may be connected to a second connection electrode CE2. The cathode electrode CATH may be connected to an eight electrode ME8 through a seventh contact hole PT7 penetrating the bank layer BK, and an eighth contact hole PT8 penetrating the first to third color filters CF1, CF2, and CF3, and the passivation layer PAS. The second power voltage transmitted from the second connection electrode CE2 may be applied to the cathode electrode CATH. The eight electrode ME8 may be the second power electrode SSE2 of FIG. 2.

A first angle a1 of the fifth contact hole PT5 and the seventh contact hole PT7 with respect to the lower surface of the bank layer BK may be about 60 degrees to about 80 degrees. A second angle a2 of the sixth contact hole PT6 and the eighth contact hole PT8 with respect to the lower surface of the bank layer BK may be about 80 degrees to about 90 degrees. The sixth contact hole PT6 and the eighth contact hole PT8 may be formed by a laser drilling process to be thinner and further inclined than the fifth contact hole PT5 and the seventh contact hole PT7.

The second driving transistor DTR2 may include a second lower electrode BML2, a second active layer ACT2, and fifth to seventh electrodes ME5, ME6, and ME7.

Figure 6:
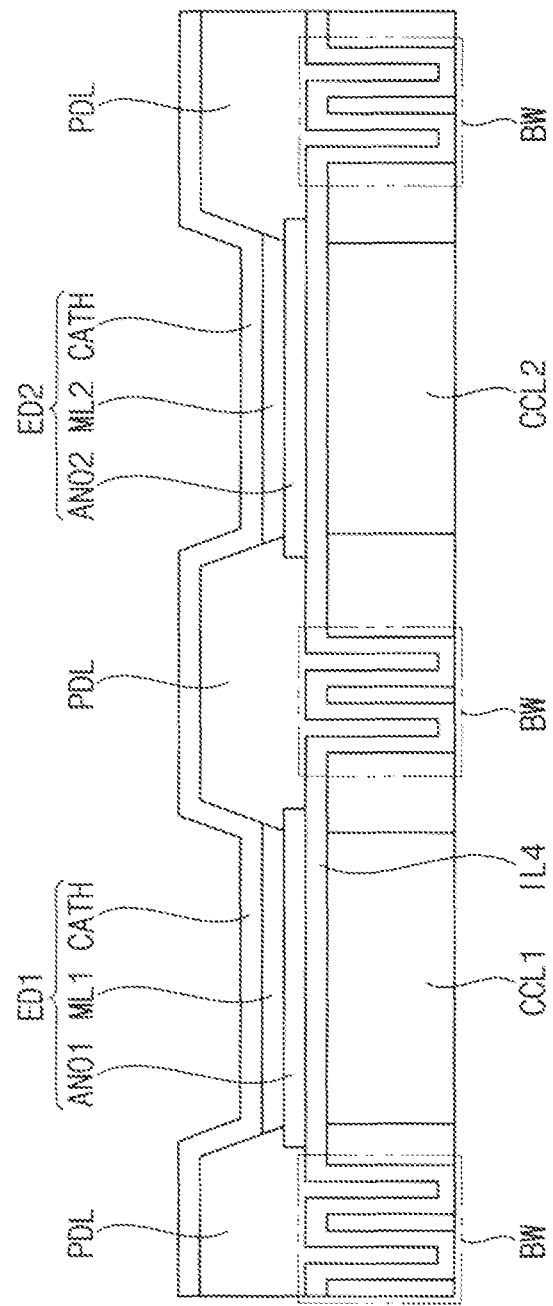
FIG. 6 is a cross-sectional view illustrating light-emitting elements included in the display device of FIG. 1.

FIG. 6 is a cross-sectional view illustrating light-emitting elements included in the display device of FIG. 1. FIG. 6 may illustrate an arrangement of different light-emitting elements in a cross-sectional view.

Referring to FIG. 6, different light-emitting elements and different color conversion layers may be disposed adjacent to each other. Although the first and the second light-emitting elements ED1 and ED2 and the first and second color conversion layers CCL1 and CCL2 are illustrated in FIG. 6, other light-emitting elements and other color conversion layers not shown in FIG. 6 may also be disposed adjacent to each other.

Figure 7:
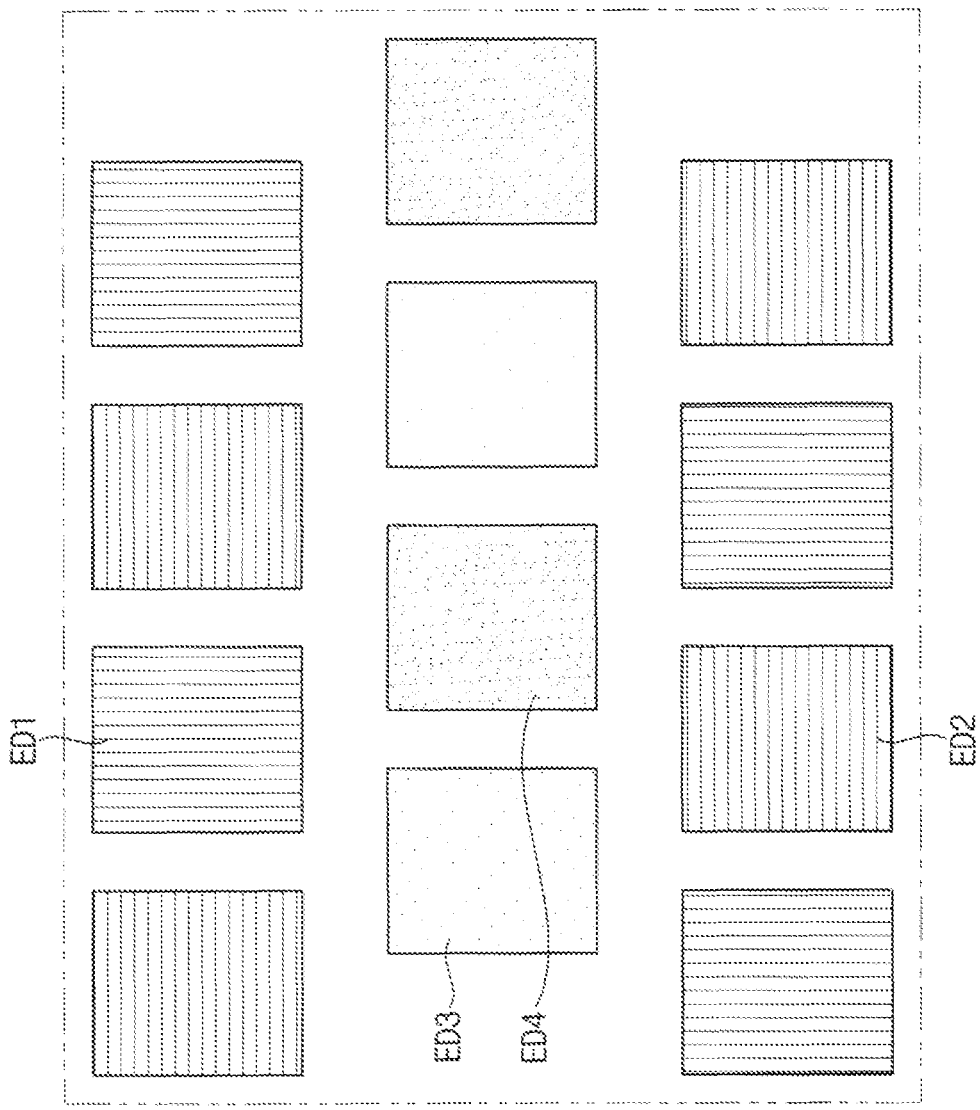
FIG. 7 is a plan view illustrating light-emitting elements included in the display device of FIG. 1.

FIG. 7 is a plan view illustrating light-emitting elements included in the display device of FIG. 1. FIG. 7 may illustrate an arrangement of different light-emitting elements in a plan view.

Referring to FIG. 7, the first to fourth light-emitting elements ED1, ED2, ED3, and ED4 may be arranged in a diamond shape in a plan view.

FIG. 8, FIG. 9, FIG. 10, FIG. 11, FIG. 12, FIG. 13, FIG. 14, FIG. 15, FIG. 16, and FIG. 17 are diagrams illustrating a method of manufacturing the display device of FIG. 1.

Figure 8:
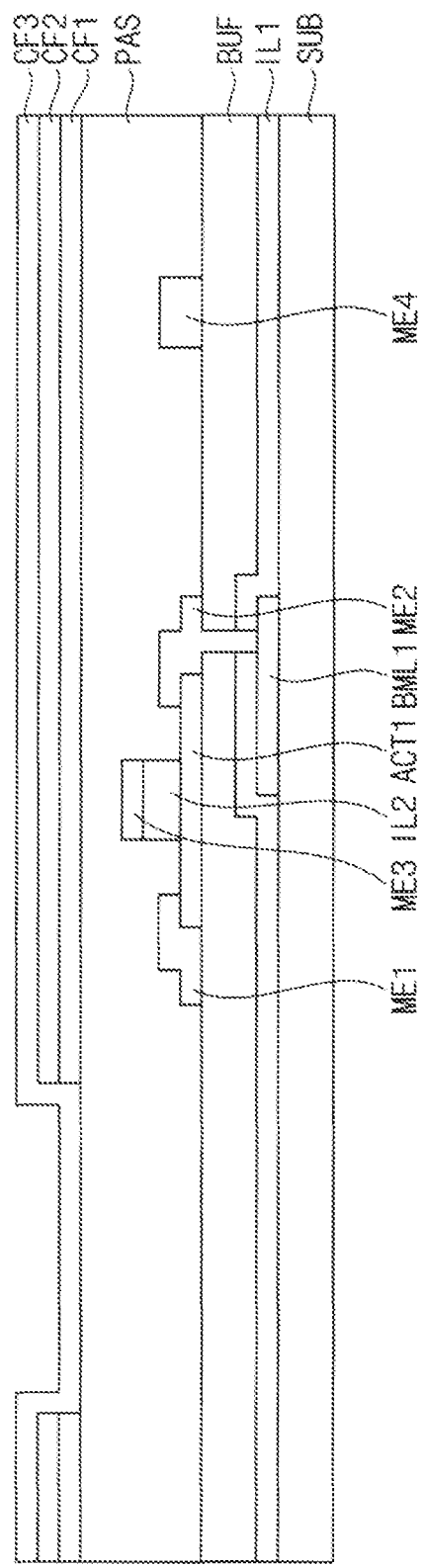
FIG. 8, FIG. 9, FIG. 10, FIG. 11, FIG. 12, FIG. 13, FIG. 14, FIG. 15, FIG. 16, and FIG. 17 are diagrams illustrating a method of manufacturing the display device of FIG. 1.
Figure 9:
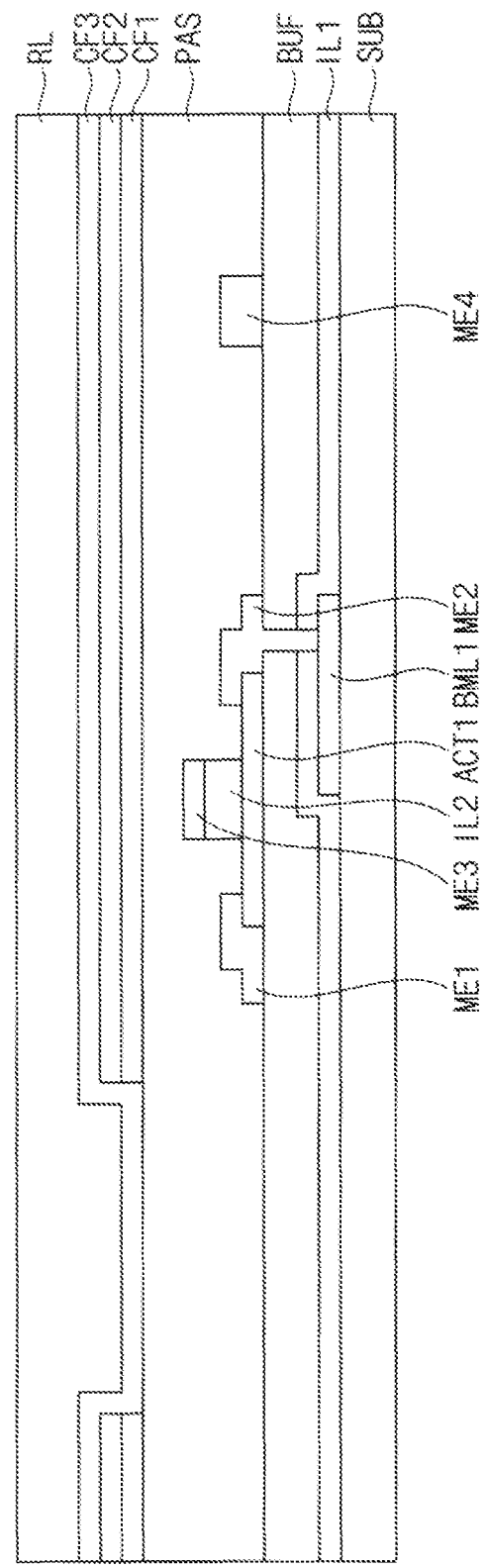
Figure 10:
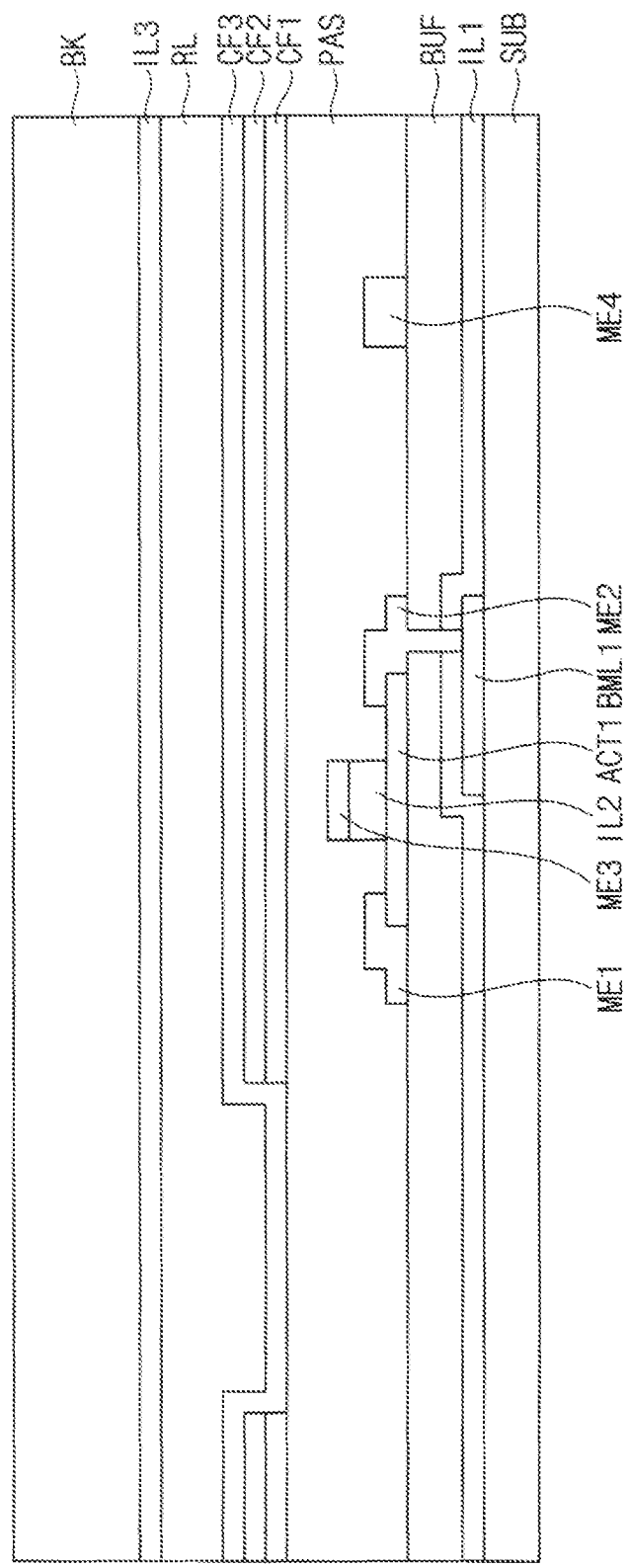

Referring to FIG. 8, the first to third color filters CF1, CF2, and CF3 may be formed on the transistor substrate. After that, as shown in FIG. 9, the refractive layer RL may be formed on the first to third color filters CF1, CF2, and CF3. After that, as shown in FIG. 10, the third insulation layer IL3 and the bank layer BK may be formed sequentially.

Figure 11:
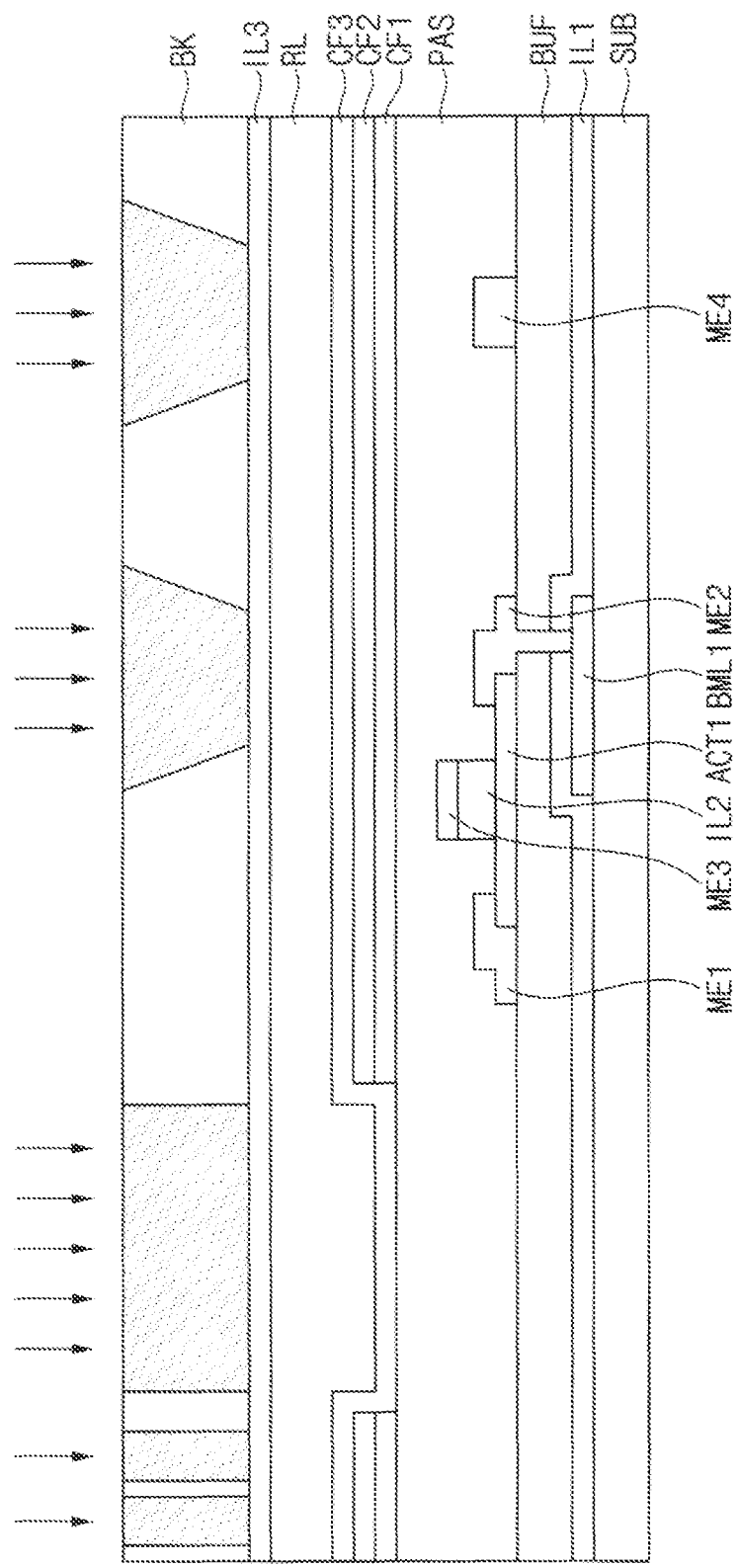
Figure 12:
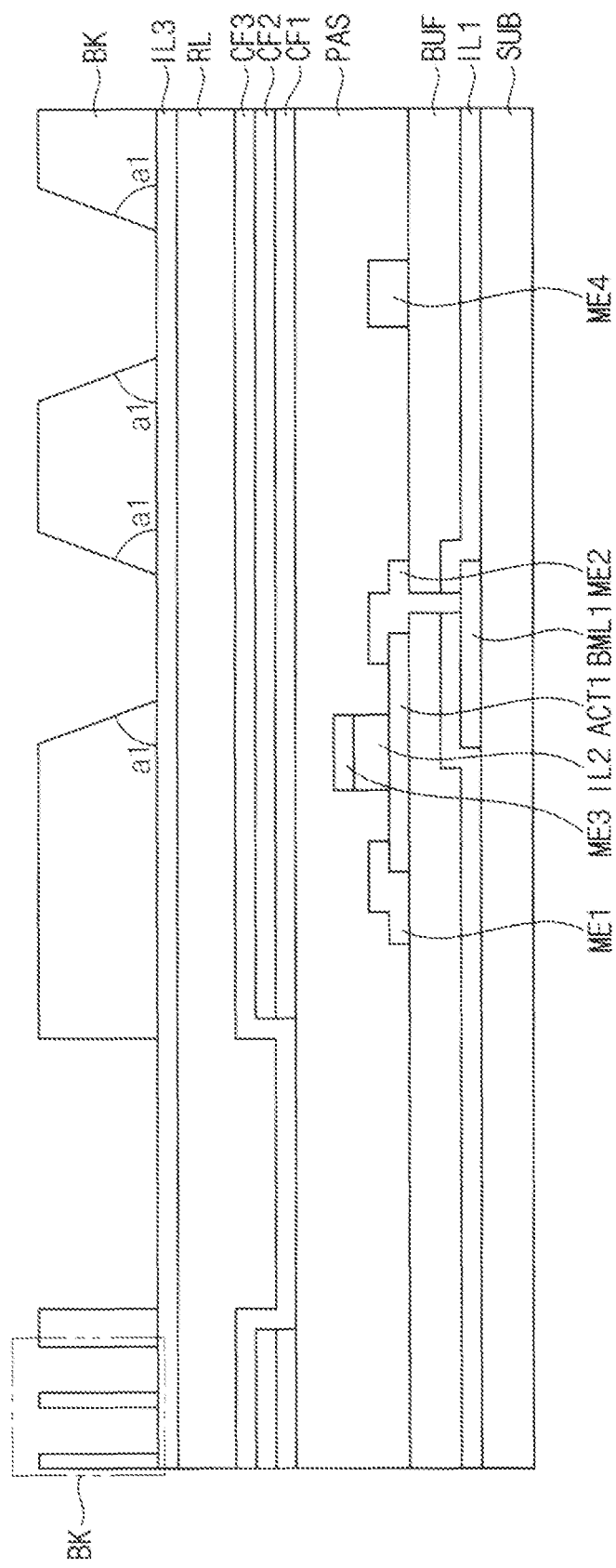
Figure 13:
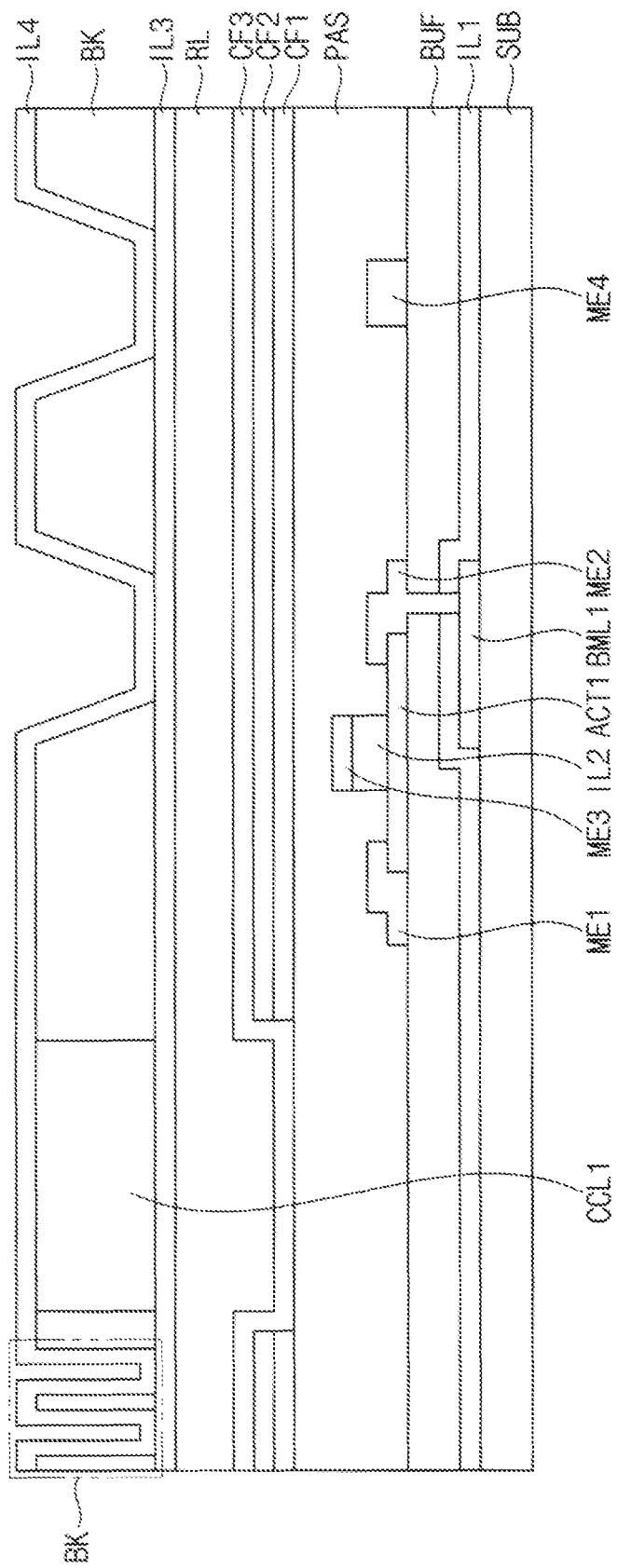

After that, as shown in FIG. 11 and FIG. 12, patterns may be formed in the bank layer BK. In this case, the bank layer BK may be patterned through an etching process. Among the patterns, pattern having an inclination may have an angle of about 60 degrees to about 80 degrees with respect to the lower surface of the bank layer BK. After that, as shown in FIG. 13, the fourth insulation layer IL4 may cover the bank layer BK.

Figure 14:
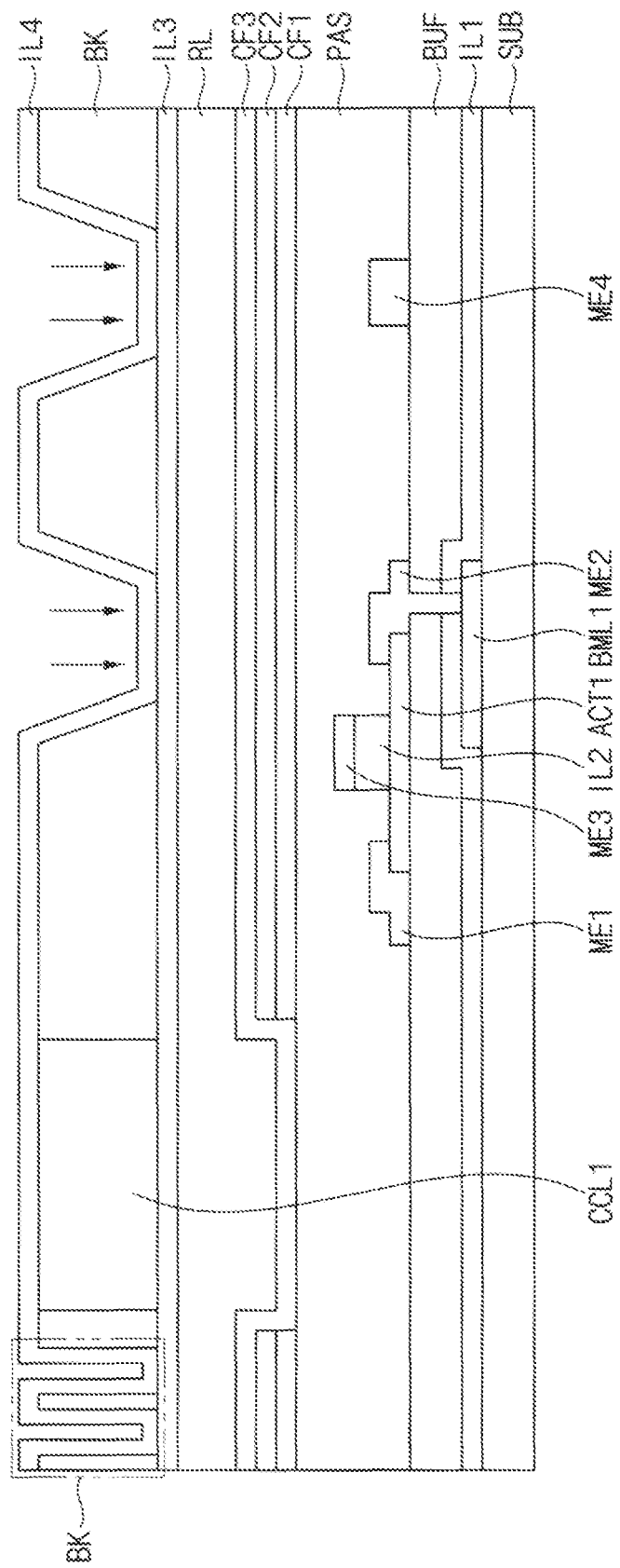
Figure 15:
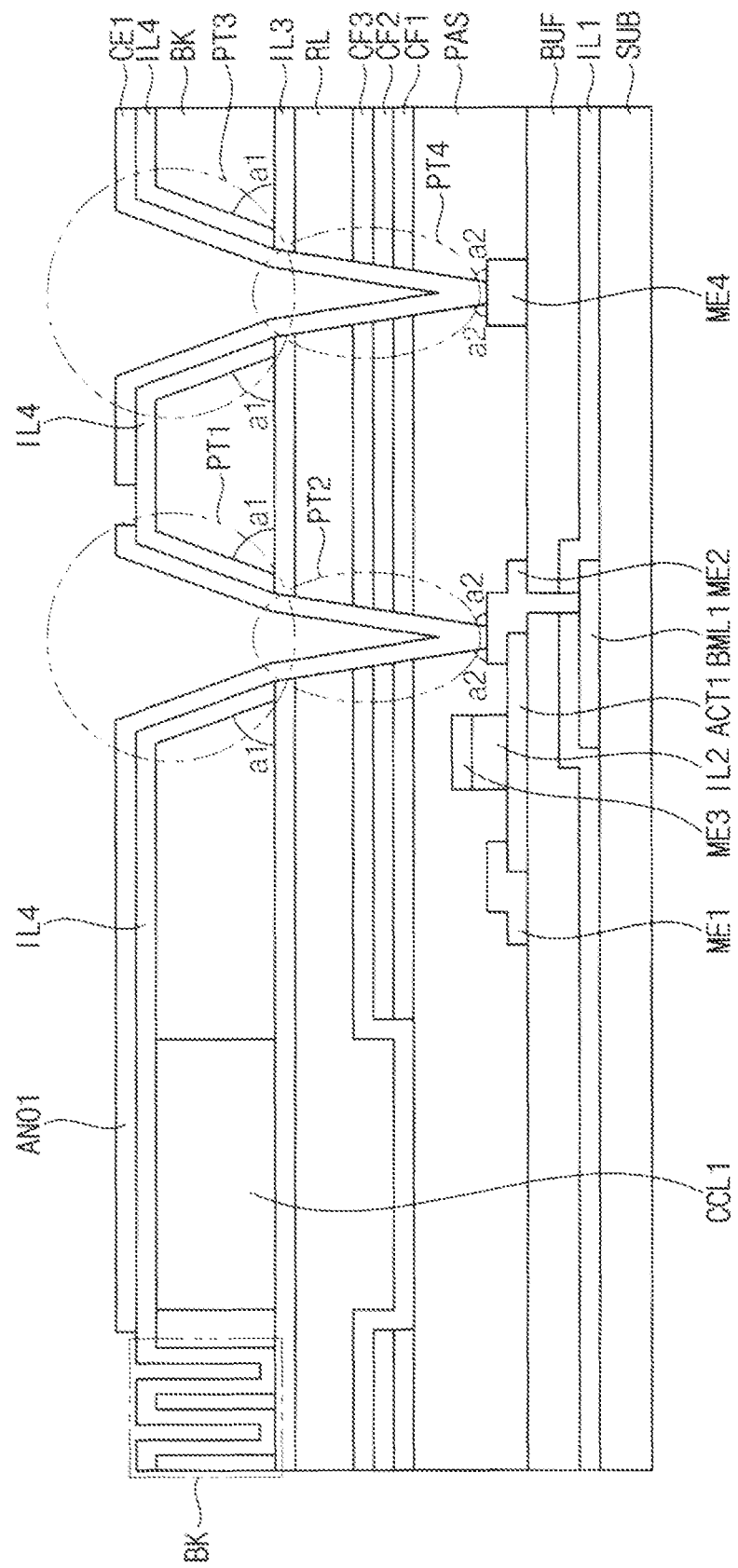

After that, as shown in FIG. 14 and FIG. 15, patterns penetrating the refractive layer RL, the first to third color filter layer CF1, CF2, and CF3, and the passivation layer PAS may be formed. The patterns may be formed by a laser drilling process. The patterns formed by the laser drilling process may have an angle of about 80 degrees to about 90 degrees with respect to the lower surface of the bank layer BK. After that, the first anode electrode ANO1 may connect to the second electrode ME2 through the first contact hole PT1 and the second contact hole PT2, and the first connection electrode CE1 may connect to the third contact hole PT3 and the fourth contact hole PT4.

Figure 16:
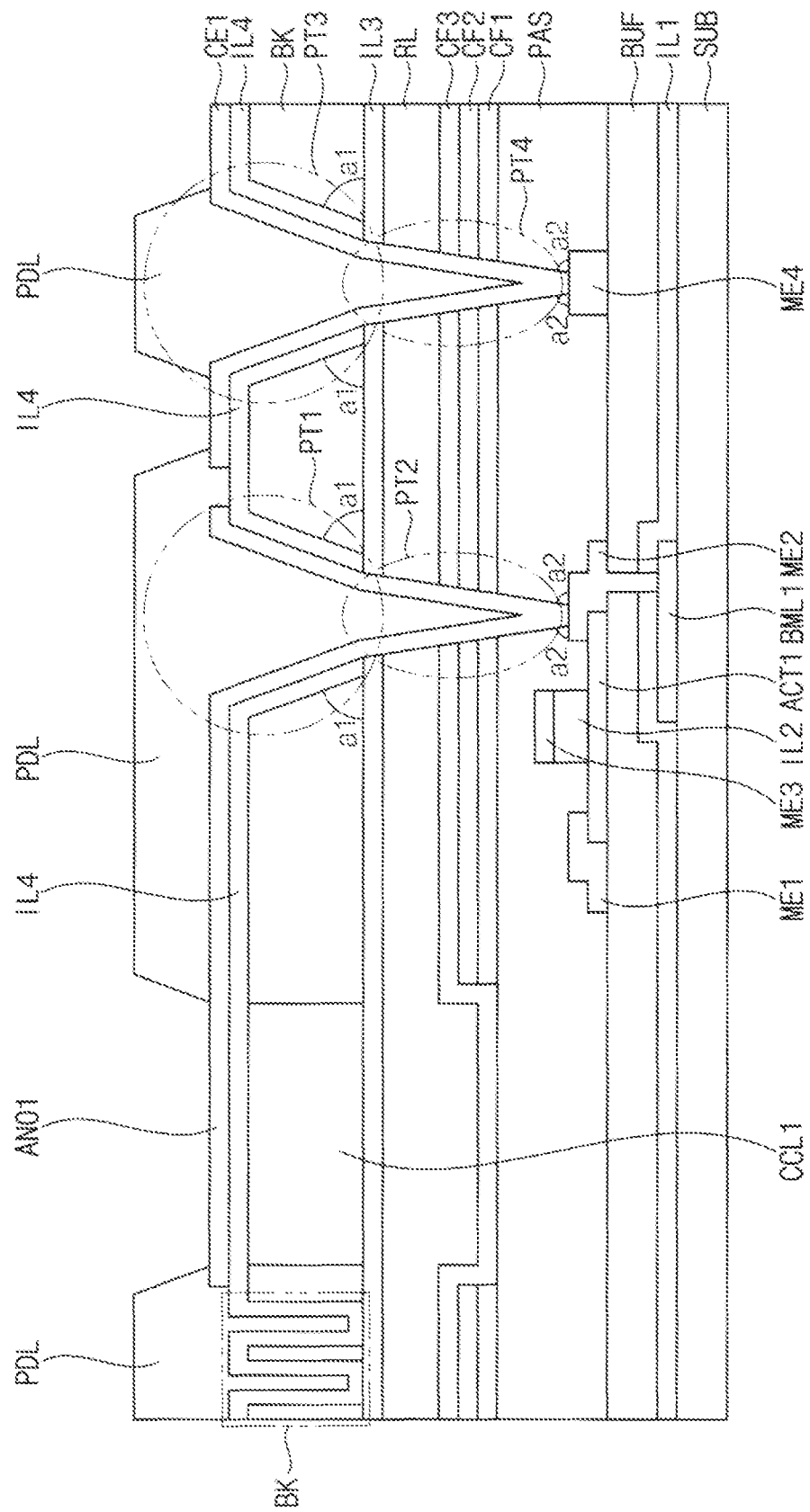
Figure 17:
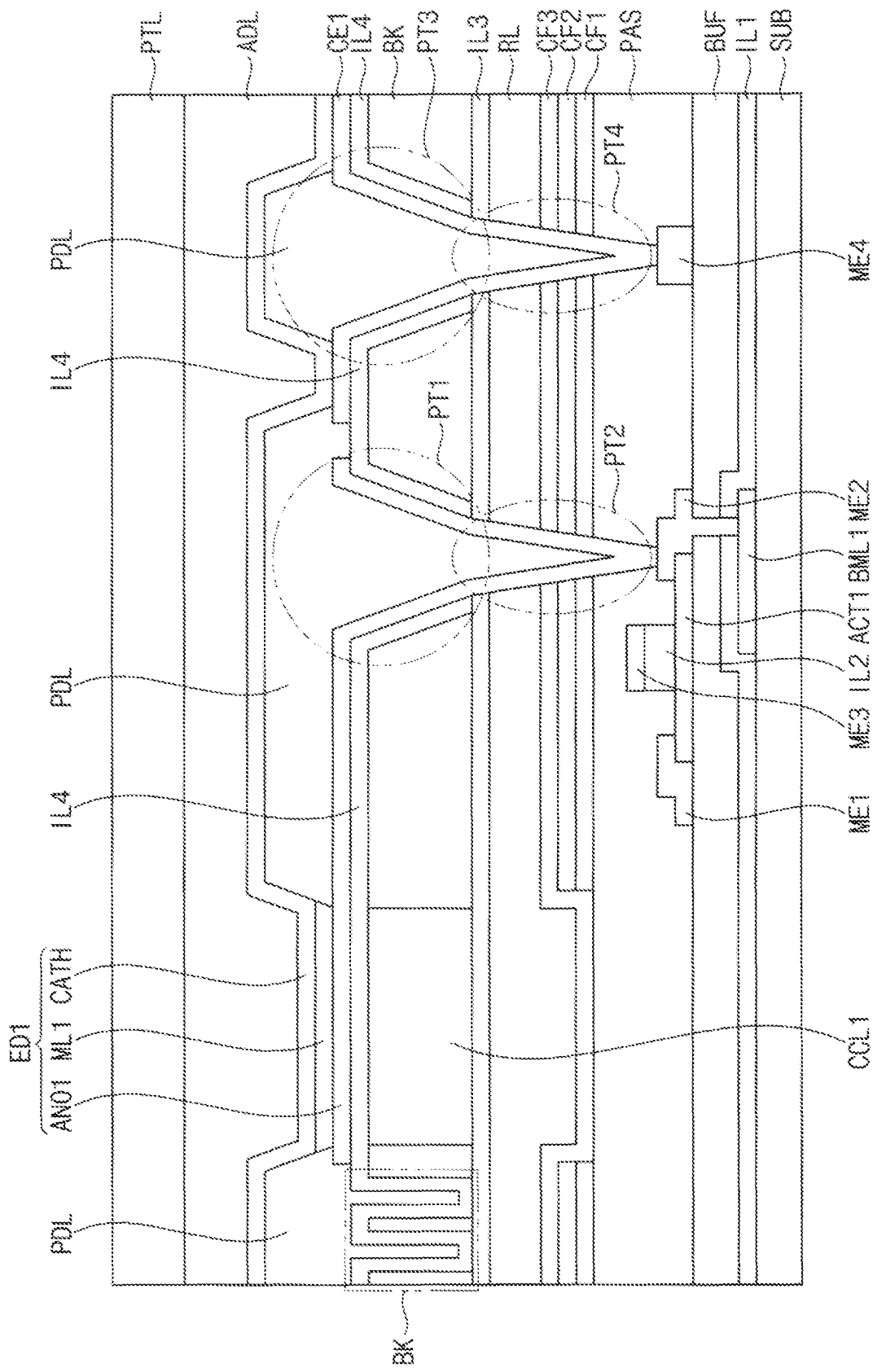

Referring to FIG. 16, the pixel defining layer PDL may fill the concave pattern BW. After that, an opening exposing the first connection electrode CE1 and the first anode electrode ANO1 may be formed in the pixel defining layer PDL. After that, as shown in FIG. 17, the first light-emitting layer ML1, the cathode electrode CATH, the adhesive layer ADL, and the protective layer PTL may be additionally formed.

Although illustrative embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device, comprising:
a transistor substrate comprising a first transistor and a second transistor;
a first color conversion layer and a second color conversion layer disposed on the transistor substrate;
a bank layer which surrounds the first color conversion layer and the second color conversion layer, and in which a concave pattern is defined;
a first light-emitting element and a second light-emitting element, the first light-emitting element and the second light-emitting element are disposed above the first color conversion layer and the second color conversion layer, respectively, overlap the first color conversion layer and the second color conversion layer, respectively, and emit light in a direction towards the first color conversion layer and the second color conversion layer, respectively;
a pixel defining layer above the bank layer and surrounding the first light-emitting element and the second light-emitting element; and
an insulation layer in direct contact with a top surface of the bank layer, with a top surface of the first color conversion layer and with a top surface of the second color conversion layer, wherein
the insulation layer partially fills the concave pattern,
the pixel defining layer further fills the concave pattern,
the bank layer is a different material than a material of the insulation layer.

2. The display device of claim 1, further comprising: a plurality of color filters disposed between the transistor substrate and the bank layer; and a refractive layer disposed between the plurality of color filters and the bank layer.

3. The display device of claim 2, wherein an opening exposing the transistor substrate is defined in the plurality of color filters in an area overlapping the first color conversion layer.

4. The display device of claim 2, wherein the plurality of color filters overlaps each other in an area overlapping the concave pattern.

5. The display device of claim 2, wherein,
each of the first color conversion layer and the second color conversion layer comprises a scattering body, and
the second color conversion layer further comprises a quantum dot.

6. The display device of claim 2, wherein,
the first light-emitting element is connected to the first transistor through a first contact hole penetrating the bank layer, and a second contact hole penetrating the plurality of color filters and the transistor substrate, and
the second light-emitting element is connected to the second transistor through a third contact hole penetrating the bank layer, and a fourth contact hole penetrating the plurality of color filters and the transistor substrate.

7. The display device of claim 6, wherein,
a first angle of each of the first contact hole and the third contact hole with respect to a lower surface of the bank layer is smaller than a second angle of each of the second contact hole and the fourth contact hole with respect to an upper surface of the transistor substrate.

8. The display device of claim 7, wherein, the first angle is 60 degrees to 80 degrees, and the second angle is 80 degrees to 90 degrees.

9. The display device of claim 2, wherein,
the transistor substrate further comprises a first voltage electrode connected to the first light-emitting element and a second voltage electrode connected to the second light-emitting element,
the first light-emitting element is connected to the first voltage electrode through a first contact hole penetrating the bank layer, and a second contact hole penetrating the plurality of color filters and the transistor substrate, and the second light-emitting element is connected to the second voltage electrode through a third contact hole penetrating the bank layer, and a fourth contact hole penetrating the plurality of color filters and the transistor substrate.

10. The display device of claim 9, wherein,
a first angle of each of the first contact hole and the third contact hole with respect to a lower surface of the bank layer is smaller than a second angle of each of the second contact hole and the fourth contact hole with respect to an upper surface of the transistor substrate.

11. The display device of claim 10, wherein, the first angle is 60 degrees to 80 degrees, and the second angle is 80 degrees to 90 degrees.

12. A display device, comprising:
a transistor substrate comprising a first transistor, a second transistor, a third transistor, and a fourth transistor;
a plurality of color filters disposed on the transistor substrate;
a refractive layer disposed on the plurality of color filters;
a first color conversion layer, a second color conversion layer, a third color conversion layer, and a fourth color conversion layer disposed on the refractive layer;
a bank layer which surrounds the first color conversion layer, the second color conversion layer, the third color conversion layer, and the fourth color conversion layer, and in which a concave pattern is defined;
a first light-emitting element, a second light-emitting element, a third light-emitting element, and a fourth light-emitting element, the first light-emitting element, the second light-emitting element, the third light-emitting element, and the fourth light-emitting element are disposed above the first color conversion layer, the second color conversion layer, the third color conversion layer, and the fourth color conversion layer, respectively, overlap the first color conversion layer, the second color conversion layer, the third color conversion layer, and the fourth color conversion layer, respectively, and emit light in a direction towards the first color conversion layer, the second color conversion layer, the third color conversion layer, and the fourth color conversion layer, respectively;
a pixel defining layer above the bank layer and surrounding the first light-emitting element, the second light-emitting element, the third light-emitting element, and the fourth light-emitting element; and
an insulation layer in direct contact with a top surface of the bank layer, with a top surface of the first color conversion layer, with a top surface of the second color conversion layer, with a top surface of the third color conversion layer, and with a top surface of the fourth color conversion layer, wherein
the insulation layer partially fills the concave pattern,
the pixel defining layer further fills the concave pattern,
the bank layer is a different material than a material of the insulation layer.

13. The display device of claim 12, wherein the first light-emitting element, the second light-emitting element, the third light-emitting element, and the fourth light-emitting element are arranged in a stripe shape in a plan view.

14. The display device of claim 12, wherein the first light-emitting element, the second light-emitting element, the third light-emitting element, and the fourth light-emitting element are arranged in a diamond shape in a plan view.

15. The display device of claim 12, wherein the plurality of color filters comprises an opening exposing the transistor substrate in an area overlapping the first color conversion layer, and
the plurality of color filters overlaps each other in an area overlapping the concave pattern.

16. The display device of claim 12, wherein,
each of the first color conversion layer, the second color conversion layer, the third color conversion layer, and the fourth color conversion layer comprises a scattering body, and
each of the second color conversion layer, the third color conversion layer, and the fourth color conversion layer further comprises a quantum dot.

17. The display device of claim 12, wherein,
the first light-emitting element is connected to the first transistor through a first contact hole penetrating the bank layer, and a second contact hole penetrating the plurality of color filters and the transistor substrate, and
the second light-emitting element is connected to the second transistor through a third contact hole penetrating the bank layer, and a fourth contact hole penetrating the plurality of color filters and the transistor substrate, and
the third light-emitting element is connected to the third transistor through a fifth contact hole penetrating the bank layer, and a sixth contact hole penetrating the plurality of color filters and the transistor substrate, and
the fourth light-emitting element is connected to the fourth transistor through a seventh contact hole penetrating the bank layer, and an eighth contact hole penetrating the plurality of color filters and the transistor substrate.

18. The display device of claim 17, wherein, a first angle of each of the first contact hole, the third contact hole, the fifth contact hole, and the seventh contact hole with respect to a lower surface of the bank layer is smaller than a second angle of each of the second contact hole, the fourth contact hole, the sixth contact hole, and the eighth contact hole with respect to an upper surface of the transistor substrate, the first angle is 60 degrees to 80 degrees, and the second angle is 80 degrees to 90 degrees.

19. The display device of claim 12, wherein,
the transistor substrate further comprises a first voltage electrode, a second voltage electrode, a third voltage electrode, and a fourth voltage electrode connected to the first light-emitting element, the second light-emitting element, the third light-emitting element, and the fourth light-emitting element,
the first light-emitting element is connected to the first voltage electrode through a first contact hole penetrating the bank layer, and a second contact hole penetrating the plurality of color filters and the transistor substrate,
the second light-emitting element is connected to the second voltage electrode through a third contact hole penetrating the bank layer, and a fourth contact hole penetrating the plurality of color filters and the transistor substrate,
the third light-emitting element is connected to the third voltage electrode through a fifth contact hole penetrating the bank layer, and a sixth contact hole penetrating the plurality of color filters and the transistor substrate, and
the fourth light-emitting element is connected to the fourth voltage electrode through a seventh contact hole penetrating the bank layer, and an eighth contact hole penetrating the plurality of color filters and the transistor substrate.

20. The display device of claim 19, wherein, a first angle of each of the first contact hole, the third contact hole, the fifth contact hole, and the seventh contact hole with respect to a lower surface of the bank layer is smaller than a second angle of each of the second contact hole, the fourth contact hole, the sixth contact hole, and the eighth contact hole with respect to an upper surface of the transistor substrate, the first angle is 60 degrees to 80 degrees, and the second angle is 80 degrees to 90 degrees.

* * * * *